United States Patent [19]
Holton

[11] 4,084,130
[45] Apr. 11, 1978

[54] LASER FOR INTEGRATED OPTICAL CIRCUITS

[75] Inventor: William C. Holton, Dallas, Tex.

[73] Assignee: Texas Instruments Incorporated, Dallas, Tex.

[21] Appl. No.: 695,229

[22] Filed: Jun. 11, 1976

Related U.S. Application Data

[60] Division of Ser. No. 575,862, May 9, 1975, Pat. No. 4,007,978, which is a continuation of Ser. No. 434,469, Jan. 18, 1974, abandoned.

[51] Int. Cl.² ............................................. H01S 3/19
[52] U.S. Cl. ............................................. 331/94.5 H
[58] Field of Search ............... 331/94.5 H, 94.5 C; 350/96 WG; 357/18

[56] References Cited

U.S. PATENT DOCUMENTS

| | | | |
|---|---|---|---|
| 3,801,391 | 4/1972 | Dyment et al. | 357/18 |
| 3,902,133 | 8/1975 | Watts | 331/94.5 H |

*Primary Examiner*—Stanley D. Miller, Jr.
*Assistant Examiner*—James W. Davie
*Attorney, Agent, or Firm*—Rene' E. Grossman; Jim Comfort; Stephen B. Goldman

[57] ABSTRACT

Semiconductor laser of electrically pumped type comprising a substrate of III-V compound semiconductor material or mixed ternary III-V semiconductor composition having a mesa structure provided with a p-n junction between regions of opposite conductivity therein. An electrical power source is connected to the mesa and upon activation causes the injection of minority carriers across the p-n junction, such that laser radiation is produced from the p-n junction.

1 Claim, 26 Drawing Figures

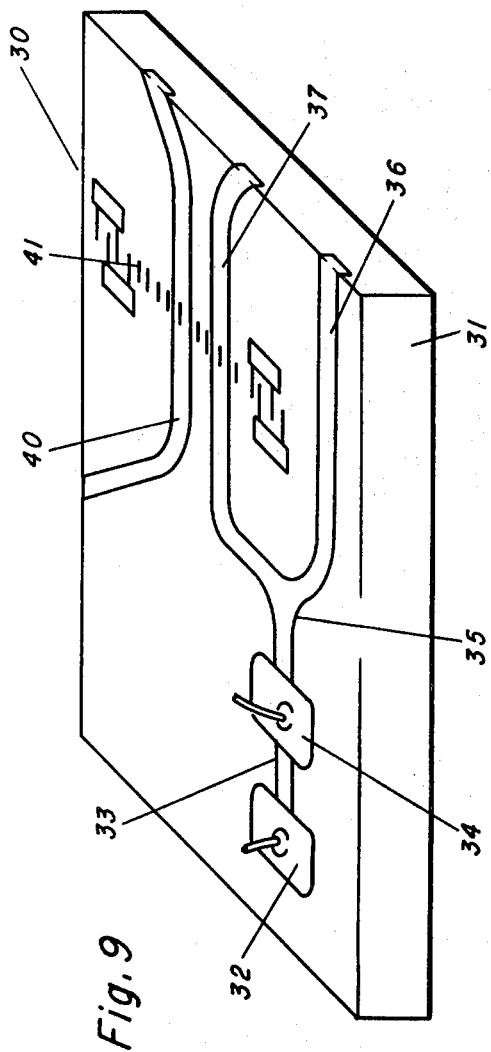
Fig. 9
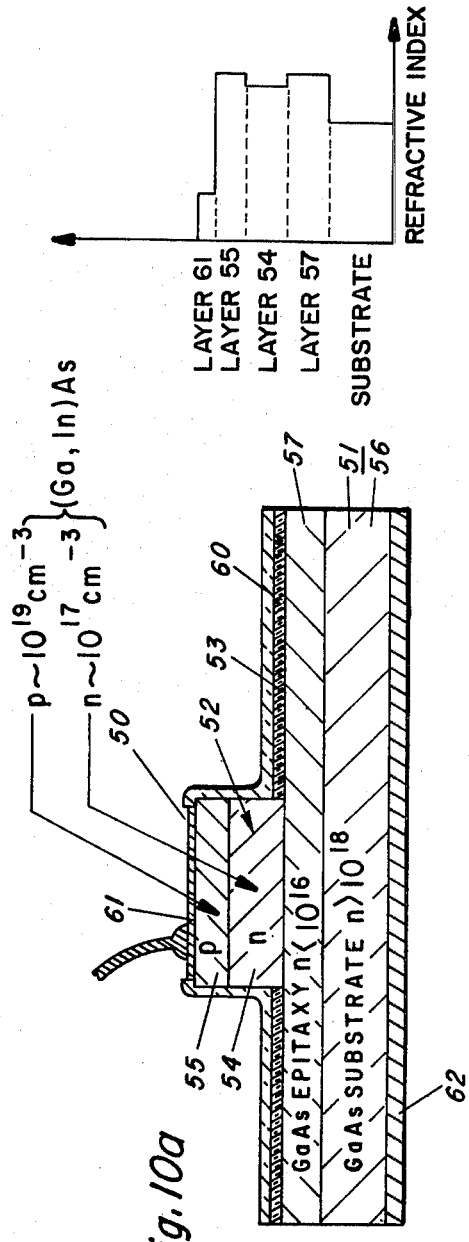
Fig. 10a
Fig. 10b

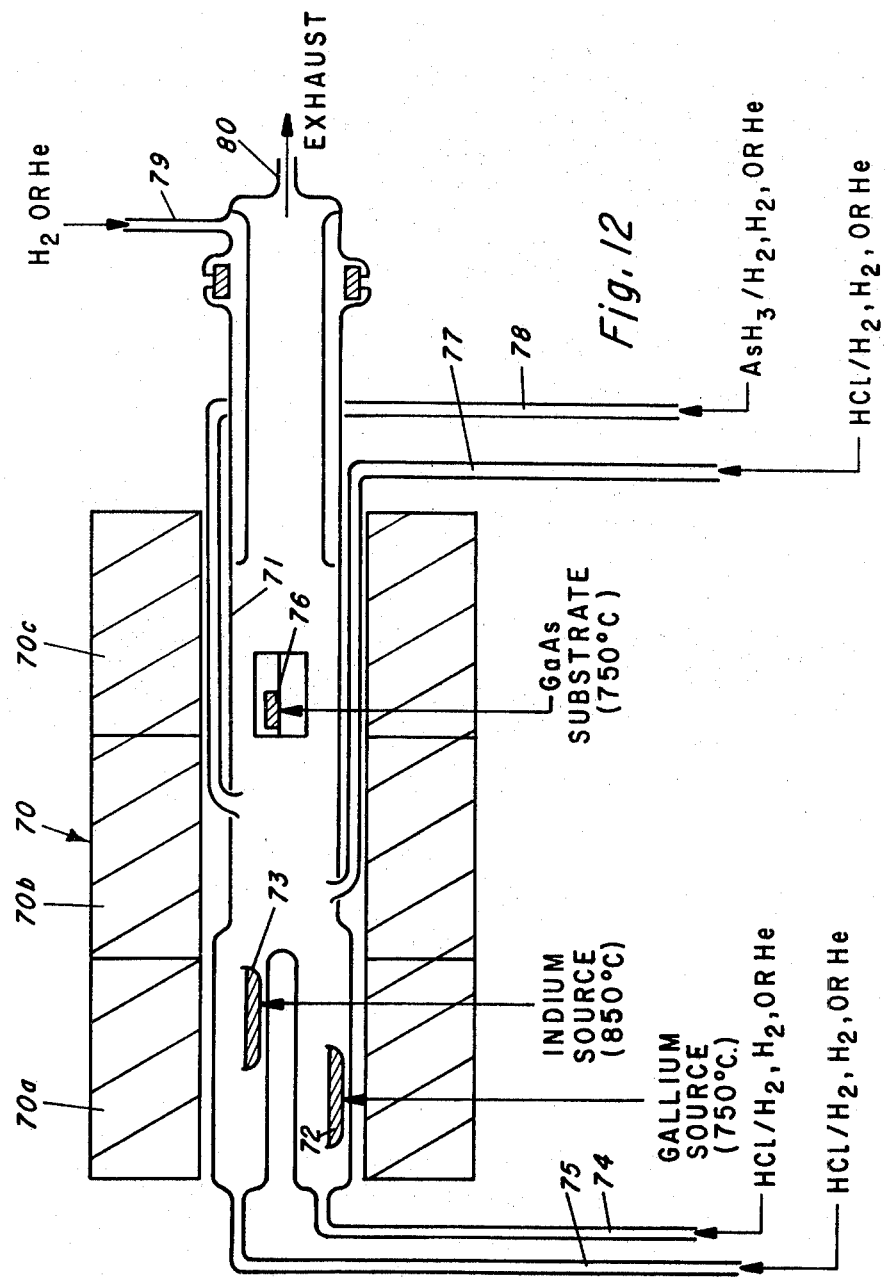

LASER FOR INTEGRATED OPTICAL CIRCUITS

This application is a division of U.S. application Ser. No. 575,862 filed May 9, 1975, now U.S. Pat. No. 4,007,978, which is a continuation of U.S. application Ser. No. 434,469 filed Jan. 18, 1974, now abandoned.

This invention relates to an optical transmitting system and, more specifically, to such a system operating in the optical frequency region and capable of being produced on a small semiconductor chip.

In the transmission of large volumes of information, it is advantageous to employ a carrier frequency as high as possible to achieve the greatest possible bandwidth and therefore the highest possible transmission rate. Consequently, high data rate transmission is best accomplished with carrier frequencies in the optical region. Significant applications include connecting computer-to-computer and computer-to-interactive display terminals both on-site and over-lines, loop type information links interconnecting interactive terminals with full capability for multi-TV, on-site or inter-site real time production line monitoring, video conferences, and information management of integrated avionic systems, shipboard communication loops, and army command vans. Pictorial information, e.g., x-ray and thermiscope pictures, and real-time TV, are easily accomplished. The developing need for an improved communications technology associated with urban improvement, i.e., "new towns" where 30 equivalent TV channels in both directions connecting every home is envisioned, can be accomplished by a single optical communications link.

The objects and advantages of the invention to be described are (1) simplicity, both in operation and conceptual design and manufacture, (2) compatibility with integrated electronic circuits, (3) cost effectiveness compared to lower carrier frequency systems, (4) ease of time division multiplexing, (5) ability to frequency division multiplex, (6) light weight, (7) use of only non-critical materials, (8) resistance to radio frequency interference, cross talk, and grounding problems, and (9) the broad bandwidth.

It has been realized by many that a miniaturized optical transmitter coupling to an optical fiber transmission line would be necessary. Recently, optical fiber transmission lines with the required low loss of 20 dB/kilometer have been developed. This disclosure describes the integrated optical circuit transmitter fabricated on a nickel-size chip. The functions which need to be performed are (1) a source for optical pulses of different wave-lengths at a predetermined repetition rate, (2) optical waveguide transmission paths, (3) a means to pulse code modulate the optical pulse train, (4) a method of coupling several optical pulse trains onto a single optical waveguide, and (5) a technique for coupling from the surface waveguide on the chip to the optical fiber transmission line. Devices to perform each of these functions are provided herein.

In order to miniaturize the source of coherent radiation, it is necessary to have a surface laser whose output is then easily coupled to the surface optical waveguide. Not having this, it is necessary to couple energy into the guide from an external source. This has been accomplished in the prior art using prism and grating type couplers. In the device herein, these techniques are used to couple the YAG:Nd or other pulsed laser radiation to optically pump the surface laser. The surface laser in this invention provides for several sources of radiation at different wavelengths, thus allowing frequency division multiplexing.

Several prior art surface type lasers have been developed, e.g., $PrCl_3$ and various dyes, but none of these easily allow multiple frequency generation at desirable wavelengths. The surface dye laser can easily be tuned to various wavelengths, but it does not operate in the infrared which is the desirable wave-length region, nor does it have long life. The surface laser in this invention is an optically and/or electrically pumped semiconductor laser, e.g., GaAs, other III-V compounds, and mixed ternary III-V material systems. The valence band to conduction band gap is adjusted by material composition and appropriate doping to provide radiation in the wavelength region from 0.5 to 1.3 $\mu m$ region. The carrier lifetime is short enough that the laser will respond to provide superradiant-like laser radiation with minimum feedback in response to pumping from a mode-locked or cavity dumped YAG:Nd laser. Epitaxially grown regions of the semiconductor lasing media are placed on the substrate by selective epitaxy techniques. Different regions will have material with differing composition and doping to provide a variety of surface lasers with several different wavelengths of emission.

An optical beam is guided in a transparent dielectric structure deposited, grown, or implanted on a planar surface. The guide region consists of a strip of material of slightly higher index of refraction imbedded in a lower refractive index medium. It is desirable to propagate the optical wave in the lowest order fundamental mode of the guide. From consideration of the requirements for fundamental mode propagation, losses induced by bends of the waveguide, i.e., radiation losses and mode coupling, and ability to fabricate the structures by photo-lithographic techniques on a nickel-size chip, one deduces that the desirable wavelength region is 0.5 to 1.3 $\mu m$. This requires that the guide width be $\sim 10$ $\mu m$ by $\sim 0.3$ $\mu m$ thick and that the guide material have a refractive index $\sim 4\%$ greater than the material in which it is imbedded. The minimum allowable binding radius is then $\sim 4$ cm with an edge definition requirement of 0.1 $\mu m$. This invention discloses that these optical guides can be fabricated from chalcogenide glasses. The fabrication of these structures is within the current state-of-the-art of photo-lithographic technology. The use of chalcogenide glass is compatible with the semiconductor surface lasers operating at 0.5 - 1.3 $\mu m$ discussed above. Optical analogs of virtually all techniques for producing couplers, filters, and other passive microwave elements can be made. In addition, a waveguide structure with gain can be made as disclosed herein. The substrate on an epitaxially deposited semiconductor region with the proper band gap is formed just beneath the optical waveguide. This active material is then optically pumped via an external source to produce a population inversion in the material adjacent to the optical waveguide. By means of the evanescent field extending from the optical waveguide into this material, the optically guided wave is then amplified. Attenuators can be produced by the same technique.

Modulators compatible with this technology for fabrication are produced by the acousto-optic effect. Overlying the material in which the optical waveguide structure is imbedded, in a selective region is deposited a piezoelectric material like ZnO which is in turn overlaid with an interdigital metallization pattern suitable for launching an acoustic wave in the piezoelectric material. Fabricated in a manner that the layers are then compared to a wavelength of the acoustic wave, the optical wave will then be diffracted by the surface acoustic wave. For this purpose the optical waveguide is made several times greater in breadth than required for single mode propagation, possibly with several exit ports at the proper angles to intercept the diffracted optical wave.

With the realization of these devices produced on a nickel-size chip, an optical transmitter is fabricated.

The above objects and advantages and still further objects of the invention will become apparent to those skilled in the art from the following preferred embodiments thereof which are provided by way of example and not by way of limitation wherein:

FIG. 9 is a schematic perspective representation of a monolithic IOC transmitter;

FIG. 10(a) is a longitudinal sectional view of a mesa injection laser, waveguide structure in accordance with the present invention;

FIG. 10(b) is a refractive index profile of the injection laser of FIG. 10(a).

FIG. 12 is a diagrammatic view, partially in section, of a vapor phase reactor for the growth of (Ga, In) as epitaxial alloys;

Figure 15A:
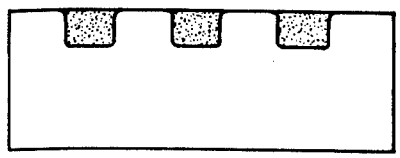
Figure 15B:
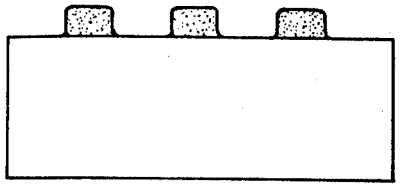
Figure 15C:
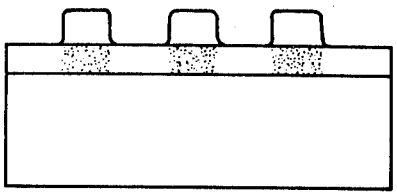
Figure 16B:
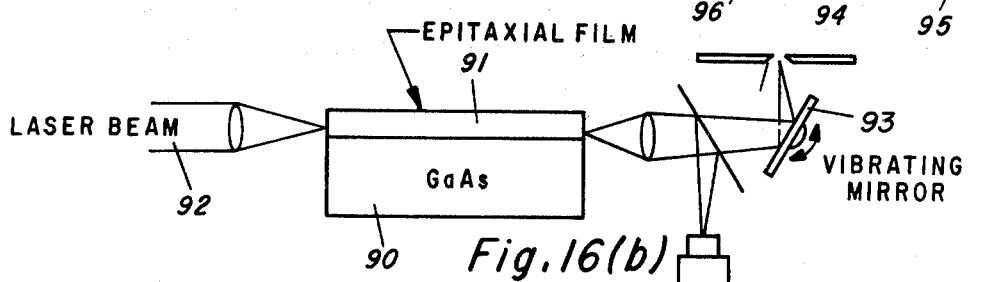
Figure 16A:
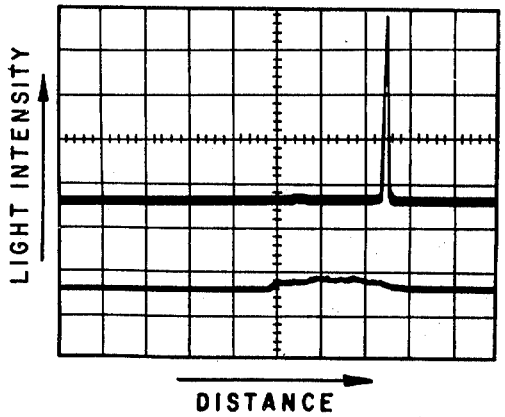

FIGS. 15(a), 15(b) and 15(c) show respective sectional views of possible geometries of three-dimensional delineated optical waveguides, 15(a) embedded channels, 15(b) raised channels, and 15(c) overlaid strip, wherein optical waveguiding occurs in the shaded regions;

FIG. 16(a) is a diagrammatic view of near-field scans showing optical waveguiding at 1.15 μm in a 7 μm (Ga,In) As epitaxial layer on a GaAs substrate; and FIG. 16(b) is a diagrammatic view of an apparatus used to take the scans shown in FIG. 16(a).

Figure 1:
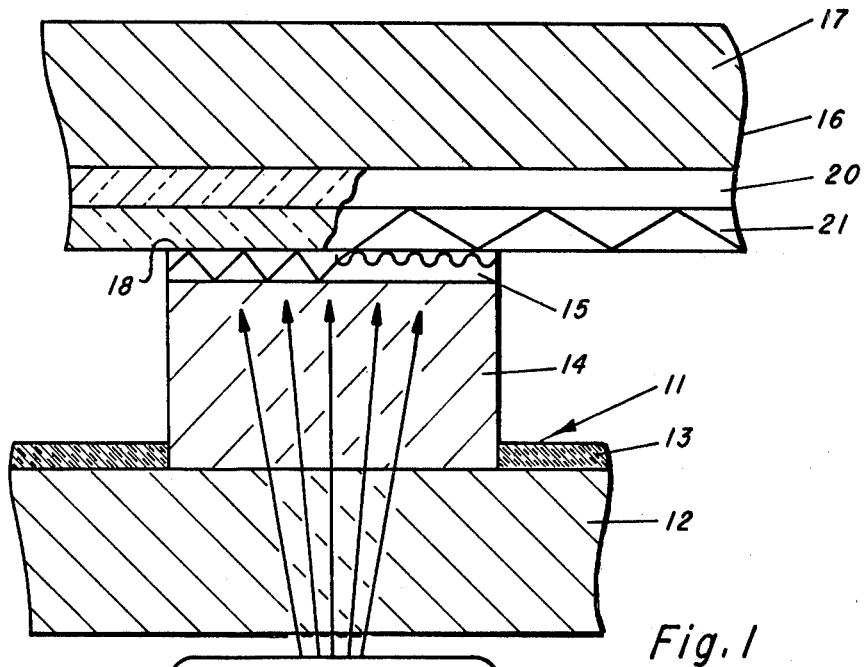
FIG. 1 is a longitudinal sectional view, partially diagrammatic, and showing an integrated surface laser-optical waveguide.

Referring first to FIGS. 1 to 8 (b), various aspects of a monolithic integrated optical source-waveguide embodiment as constructed in accordance with the present invention are illustrated therein. FIG. 1 illustrates an epitaxially grown, optically pumped surface laser whose radiation is coupled via an integral periodic structure to a planar optical waveguide. To this end, an injection pump laser 10 is provided as a source of laser radiation for a surface laser 11. The injection pump laser 10 is disposed in registration with a substrate 12 of the surface laser 11. The substrate 12 is made of semiconductor material which is preferably GaAs, but it should be understood that other III-V semiconductor compounds, and mixed ternary III-V materials may also be employed within the spirit of this invention. The substrate 12 is provided with an insulation layer 13 on the surface thereof distally related to the laser radiation source 10. The insulation layer 13 may be of a suitable oxide material and is provided with a hole or opening extending therethrough to the substrate 12. The surface laser 11 further includes a mesa 14 of semiconductor material which is formed on the substrate 12 so as to extend vertically upward therefrom through the opening in the insulation layer 13. An active surface laser layer 15 is provided on top of the mesa 14 for generating surface laser radiation. Where the substrate 12 is GaAs, the mesa 14 is preferably epitaxially grown GaAs, while the layer 15 is epitaxially grown $In_xGa_{1-x}As$. Laser radiation is generated in the active $In_xGa_{1-x}$ layer 15 grown on top of the GaAs mesa 14. This approach provides feedback to the lasing medium via the faceted edges of the mesa, waveguiding in the active medium via the higher index of refraction of the $In_xGa_{1-x}As$, and convenient pumping via the transparency of the GaAs to radiation at the $In_xGa_{1-x}As$ bandgap. A planar optical waveguide 16 is provided in juxtaposition to the layer 15 of the surface laser 11, the optical waveguide 16 comprising a substrate 17 having first and second light-transmitting layers 20 and 21 disposed on the surface thereof adjacent to the active layer 15 of the mesa laser 11. The light-transmitting layers 20 and 21 of the planar waveguide 16 are preferably fabricated from rf-sputtered layers of chalcogenide glasses. These materials have appropriate indices of refraction which are compatible with III-V semiconductors, exhibit low optical loss, and are readily sputtered to form high quality films. Coupling between the surface laser 11 and the waveguide 16 is effected by a grating structure 18 fabricated into the surface of the active layer 15. A preferred technique of producing this grating structure 18, i.e., an interferometric exposure onto photoresist, allows the grating periodicity, and therefore its coupling parameters, to be varied to produce optimum results. It is contemplated that grating couplers can be fabricated onto both laser and waveguide structures.

Figure 2:
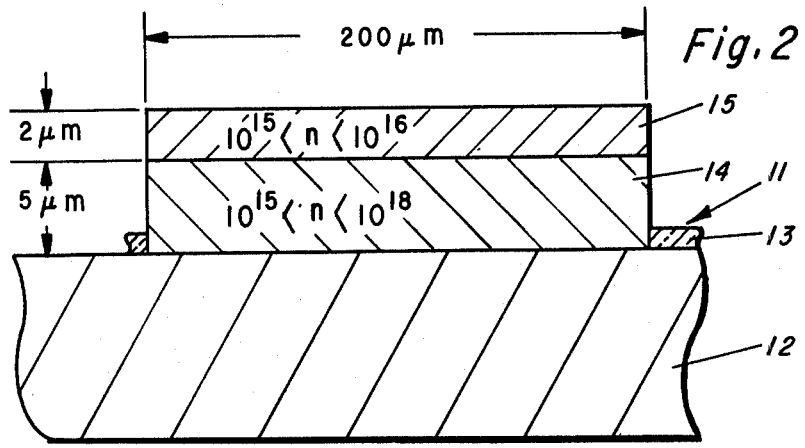
FIG. 2 is a sectional view of a mesa surface laser structure.

The surface laser 11 must perform several functions in addition to lasing: (1) it must efficiently absorb the pump radiation, (2) it must provide an optical cavity to confine the generated laser radiation, and (3) it must transmit the laser radiation to the waveguide 16. The surface laser 11 shown in FIG. 2 is a mesa 14 grown through an oxide mask 13 on a GaAs substrate 12. The active layer 15 at the top is an alloy of gallium, indium, and arsenic. Only a small amount of indium (a few percent) is required to shift the bandgap below that of GaAs in order to confine the produced laser radiation and absorb the pump radiation. This alloy composition is close to $Ga_{0.95}In_{0.05}As$.

A number of vapor and liquid phase epitaxial processes could be chosen from growth of the heteroepitaxial mesa 14. Liquid phase processes, in general, are not useful in this type of growth because two different materials are required, and the proposed dimensions of the mesa 14 cannot be easily controlled. A preferred process for the preparation of the mesa 14 is a vapor phase process which utilizes gallium, a gallium-indium alloy, HCl, and arsine in excess hydrogen. In this process, GaAs can be grown, followed by growth of ternary alloy compositions of indium in GaAs. Growth rates are low enough so that these thin films can be prepared in a reproducible, controlled manner.

Figure 3:
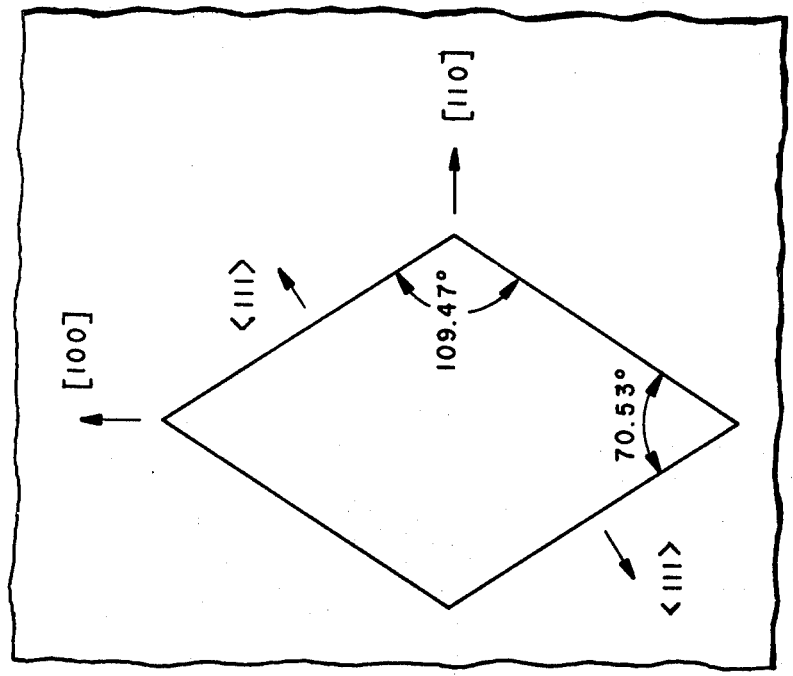
FIG. 3 is a diagrammatic view of a mask orientation for the growth of surface lasers.

These heteroepitaxial films are grown through oxide masks. This technique provides for the unique formation of an optical cavity with parallel opposite faces without the need for cleaving such surfaces. The exact geometry of the holes in the masks is critical to this application because the sides of the growth must be parallel to each other and perpendicular to the substrate. To achieve this geometry, a diamond-shaped mask is used. (See FIG. 3.)The orientation of the mask with respect to the substrate is shown in FIG. 3. A scanning electron microscope photograph of the edge of the mesa 14 shows that the {111} face grows perpendicular to the {110} GaAs substrate 12. Other orientations which yield this faceted configuration may also be considered.

Figure 4:
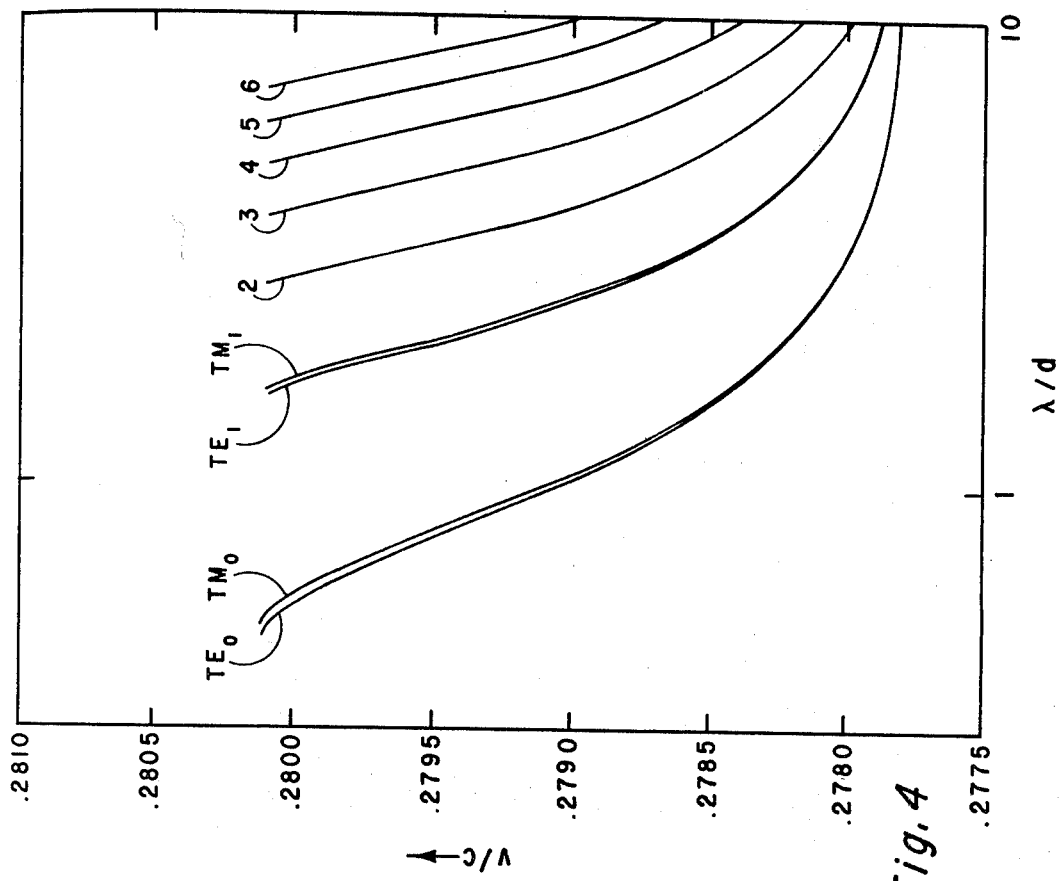
FIG. 4 is a graph showing dispersion curves for $n_0 = 2.8$, $n_1 = 3.6$, $n_2 = 3.57$.

As desired for effective device performance, single or only several low order optical mode lasing can be achieved in the surface laser 11. In FIG. 4 the passive medium dispersion curves are shown for the allowed propagation modes in the surface laser. The epitaxial surface laser will be in contact with a chalogenide glass film; consequently, the curves have been calculated for a multi-dielectric layer $n_1$, $n_2$, $n_3$, where $n_1$ = index of the chalcogenide glass, $n_2$ = index of GaInAs, and $n_3$ = index of GaAs. As seen from the figure, single mode propagation can be achieved by having $\lambda/d \leq 1.5$.

The doping of the GaInAs layer 15 is adjusted for minimum laser threshold. Two things are important to achieve this: (1) the radiative recombination process employed; and (2) lowest optical loss dependent on film perfection and, again, radiative emission wavelength relative to the band edge. Finally, the epitaxial layer 15 could be regraded to GaAS to provide a thin layer of GaAs, producing a buried lasing layer that eliminates surface recombination effects.

The laser radiation from the layer 15 of the mesa laser 11 is coupled into the planar optical waveguide 16 fabricated on a separate substrate 17. This approach permits a more complete characterization of the performance upon adjustable parameters, and allows the unit to be optimized separately.

Figure 5:
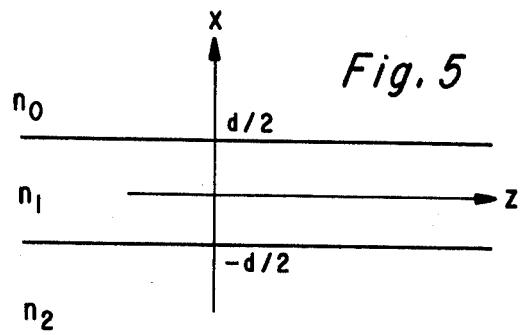
FIG. 5 is a diagrammatic view of a three layered dielectric waveguiding structure.

Therefore, in considering the nature of solutions of Maxwell's equations for the three-layered waveguide structure 16 of FIG. 5, the layers are of infinite extent in the y and z directions and the dielectric constants are $n_0$, $n_1$, and $n_2$. The fields are assumed not to vary in the y direction and to vary with time and distance along the z axis as $\exp i(\omega t - \beta z)$. The Maxwell's equations yield two types of solution: one in which the only non-zero field components are $E_y$, $H_x$, and $H_z$ non-zero (TE waves), and another with only $H_y$, $E_x$, and $E_z$ non-zero (TM waves).

There are two kinds of solutions: (1) guided waves confined to layer 1 and decaying exponentially with distance away from layer 1 with decay constants $\gamma$ and $\alpha$, and (2) unguided waves exhibiting no such confinement. The unguided waves are important in considerations of couplers and loss mechanisms, but the guided waves are of more interest here. The TE guided wave in the three regions have fields with x-dependence.

$E_{y0} \propto \exp -\gamma(x-d), \ x > d/2$ $E_{y1} \propto \cos(kx + \phi), \ -\frac{d}{2} < x < +\frac{d}{2}$ $E_{y2} \propto \exp \alpha(x + \frac{d}{2}), \ x < -\frac{d}{2},$ where $d$ is the width of the guiding layer, and $k$ and $\phi$ are the mode structure constants. The other field components are obtained by differentiating $E_y$ with respect to $z$ or $x$. From the wave equation and boundary conditions at the two interfaces, the following relations are obtained:

$\gamma^2 - \beta^2 + n_0^2 k_0^2 = 0$ $-k^2 - \beta^2 + n_1^2 k_0^2 = 0$ $\alpha^2 - \beta^2 + n_2^2 k_0^2 = 0$, where $k_0 = 2\pi/\lambda_0$.

$\gamma/k = \tan(kd/2 + \phi)$ $-\alpha/k = \tan(-kd/2 + \phi)$.

Figure 6:
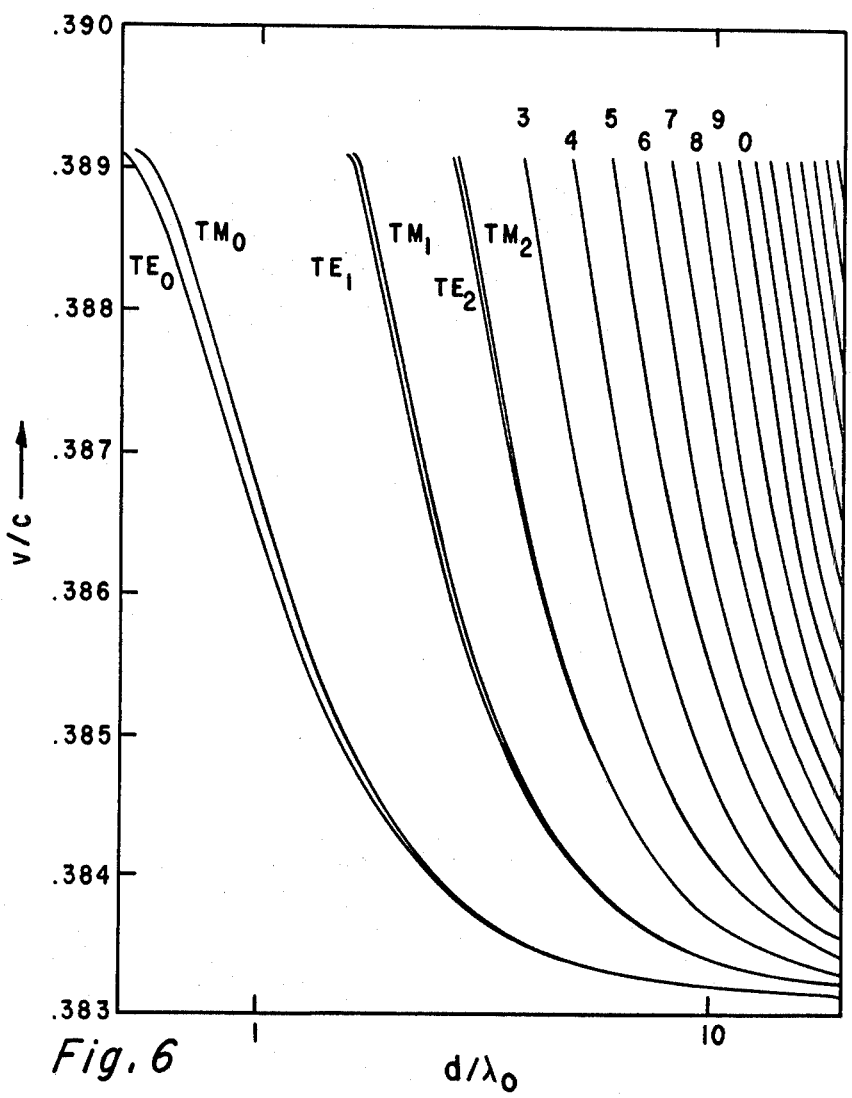
FIG. 6 is a graph showing dispersion curves for $n_0 = 1.$, $n_1 = 2.61$, $n_2 = 2.57$.

Similar equations hold for TM waves. For guided waves $n_1 > n_0$, $n_2$. $\lambda_0$ is the wavelength in vacuum. A convenient way to display the discrete solutions to these equations is a plot of $k_0/\beta = v/c$ versus $d/\lambda_0$. Such a plot is shown in FIG. 6 for the case $n_0 = 1$, $n_1 = 2.61$, $n_2 = 2.57$. This corresponds to a TI-1173 chalcogenide glass film on a TI #20 glass substrate in air. The guided modes exist in the region bounded at the top of the figure by $v/c = (2.57)^{-1}$ and at the bottom by $v/c = (2.61)^{-1}$. As film thickness increases, the number of guided modes which the film can support also increases. The modes occur in pairs. In order of increasing $d/\lambda_0$, the modes are $TE_0$ and $TM_0$, $TE_1$ and $TM_1$, etc.

Figure 7:
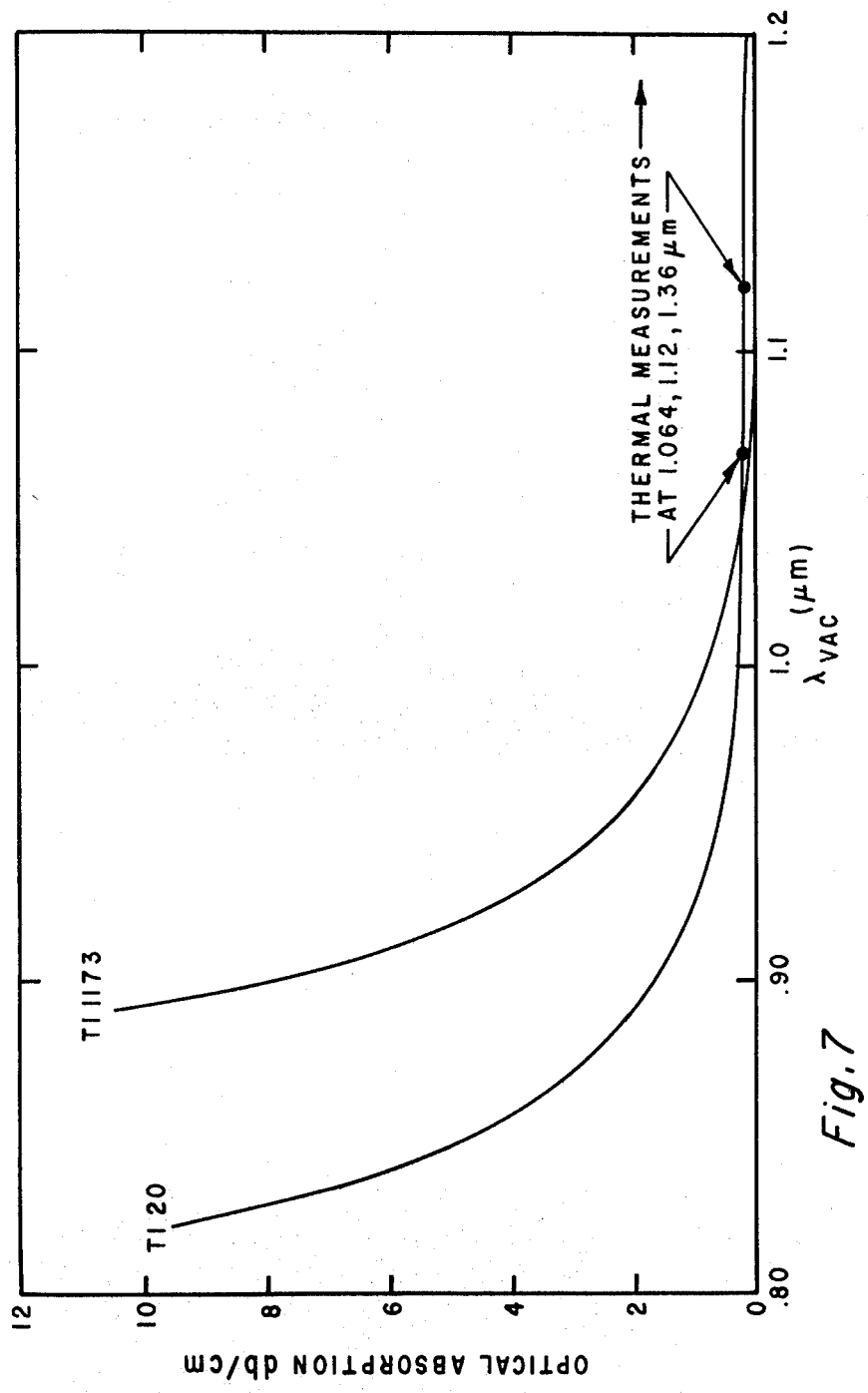
FIG. 7 is a graph showing the optical absorption of TI #20 and TI #1173 Chalogenide Glasses.

Many glasses are suitable for use as waveguides in the near-infrared, high index chalcogenide glasses being one group of glasses suitable for this purpose. FIG. 7 shows absorption curves for two such high index chalcogenide glasses known as TI #20 and TI-1173 in the spectral region of interest. The curves were measured with an absorption spectrometer and normalized to pass through the points at 1.06μm, 1.12μm, and 1.36μm, where accurate calorimetric data were taken with a YAG:Nd laser source. These data are shown in Table I.

Table I

Refractive Index and Absorption Loss (dB/cm) of TI #20 and TI-1173 Glasses

| λ(μm) | 1.064 | 1.12 | 1.358 |
|---|---|---|---|
| n(20) | 2.583 | 2.574 | 2.551 |
| n(1173) | 2.707 | 2.688 | 2.662 |
| α(20) | 0.4 | 0.4 | 0.3 |
| α(1173) | 0.3 | 0.2 | 0.07 |

$As_2S_3$ glass is also useful, with slightly lower index and improved transmission at shorter wavelengths. These glasses have excellent acousto-optic properties which are important later for modulation, deflection, and switching functions. These glasses are easy to apply to the substrate 17 of the optical waveguide 16 in thin films by the rf sputtering technique. The optical properties of the film are only slightly different from those of the bulk material. For example, the index of TI-1173 bulk material is 2.69, and that of the film is 2.61 at 1.15μm.

The surface laser 11 and waveguide structure 16 may allow a simple method for end-fire or tapered section coupling therebetween. The active laser layer 15 is elevated above its substrate 12 on a pedestal or mesa 14. For end-coupling, the waveguide 16 is raised to the correct height. See FIGS. 8(a) and 8 (b) respectively illustrating an end-fire laser output from the surface layer 15 of the mesa laser 11 and an optical waveguide 16 coupled to the mesa layer 11. For a complete monolithic device, the laser structure may be screened off during the rf sputtering of the guide substrate material and during the subsequently sputtering of the guide material. However, the interface between the edge of the laser 11 and the wavelength 16 may be difficult to define. that is, a close joint between the pedestal and the guide substrate, without either gaps or overlap of the substrate onto the pedestal and laser, may be very difficult to obtain with rf sputtering techniques.

Thus, an alternate coupling scheme of evanescent field-coupling between the laser 11 and the waveguide 16 is contemplated. In order for this coupling to take place, the phase velocity of the guide 16 and that of the laser radiation must be matched. Because the laser itself is a layered dielectric structure, it will exhibit guided propagation of its own radiation. Another structural element between laser and guide is necessary to transform the phase velocity of the laser to that of the guide. A grating structure sandwiched between the sides of the laser and the guide can perform this velocity translation. FIGS. 1 and 8 (b) show such a coupling between the surface laser 11 and the optical waveguide 16 employing a grating structure 18. The grating structure 18 may be generated in a number of ways, the simplest of which is to define a grating on a photoresist layer on the active laser layer 15 and then ion-mill the grating structure 18 into the laser structure. This allows close control over the size, position and shape of the grooves of the grating 18. After milling, the photoresist is removed from the laser surface. The laser structure is then turned over and the flat single crystal facet top surface of the layer 15 is bonded to the waveguide 16. This bond may be accomplished to several ways. Since both surfaces are flat to better than a wavelength of light, optical contacting will be possible. Alternatives are pressure bonding; an annealing near the low temperature melting point of one chalcogenide glass layer of the waveguide 16 during pressure; or use of a low viscosity optical cement, i.e., a cement layer thickness which is small compared to the guide and laser thickness. This last bonding method allows the laser and guide to be separated again by dissolving the cement.

The herein described laser-waveguide structure is extremely versatile and has a number of constructional and investigative advantages in addition to room temperature operation. The laser 11 and the waveguide 16 are constructed separately, therefore, their properties can be determined before they are joined. This is an advantage, first, because widely different materials can be used for the laser and the waveguide, so that the laser may be matched to the pump source 10 or operated at a desired wavelength, while the waveguide materials may then be chosen for low loss or other desirable properties such as compatibility with a modulator. Second, a number of identical lasers can be constructed simultaneously so that an initial error in matching phase velocities will be corrected on subsequent devices fabricated from the same laser batch. Third, injection pumping of the surface laser may be studied in parallel with the other work, such as optimization of grating length and structure.

The requirements on the grating spacing are determined from a grating formula which is derived from geometrical optics arguments. In particular, between two media of indices $n_1$ and $n_2$ the usual formula is:

$$n_1 \sin \theta_1 - n_2 \sin \theta_2 = s(\lambda/d), \qquad (1)$$

where $\theta_1$, $\theta_2$ are the incident and diffracted angles measured from the normal, $\lambda$ is the vacuum wavelength, $d$ is the grating spacing, and $s = \pm 1, \pm 2, \ldots$ is the diffraction order. The reciprocal of the phase velocity of a guide wave in a layered structure is $$(c/v) = (c/v)_{bulk} \sin \theta, \qquad (2)$$

where $c$ is the vacuum velocity of light; $(c/v)_{bulk} = n$, the bulk index of the guiding film; and $\theta$ the angle at which totally internally reflected plane waves propagate to form the guided mode. The combination of these two formulas results in the following simple relationship between phase velocities and grating:

$$(c/v)_{film} = (c/v)_{laser} + s(\lambda/d). \qquad (3)$$

The grating formula (1) is reversible, in that incident and diffracted rays may be interchanged without requiring a change in the matching parameters. A grating, therefore, not only allows radiation to be coupled into the guide, but also couples radiation out of the guide. To obtain a net coupling into the guide, the grating must be terminated abruptly and must be of the proper length.

Typical requirements on the grating spacing are on the order of $d = 1 \mu m$, an easily constructed spacing. This requirement on $d$ is obtained from Equation (3). An example for a complete grating structure is as follows. Assuming that the injection laser pump 10 emits at 9000 A, the parameters of the rest of the laser-waveguide structure may be determined thusly. The parameters of an active surface layer 15 of $Ga_{1-x}In_xAs$ may be calculated first. Little is known of the index and absorption coefficient of this ternary compound; however, it is known that this material on a substrate can be optically pumped and made to lase at room temperature. The indexes of GaAs and InAs are very nearly equal, and for the low In concentration, the ternary compound may be treated as if the index and absorption behave as they do in GaAs near the bandgap. To obtain an absorption length of 5 $\mu m$, the band edge of $Ga_{1-x}In_xAs$ should be shifted by 200 A from the pump radiation, according to the absorption coefficient tables of GaAs. From the curve of bandgap energy vs composition on $Ga_{1-x}In_x$. As this occurs for a 4.5% In concentration. The index of refraction of the ternary compound at its band edge is 3.603, i.e., the same as that of GaAs at its band edge. The GaAs index at 9200 A is 3.569. The layer 21 of the waveguide 16 coupled to the laser structure that provides guiding of the laser radiation is a chalcogenide glass such as that known as TI-1173. Its index of refraction is 2.8. The reciprocal phase velocities of the laser $(c/v)_{laser}$ then lie between 3.603 and 3.569, a 1% range at about $c/v = 3.6$. The dispersion curves for the modes are shown in FIG. 4. The waveguide 16, made up of TI-1173 glass bounded by air and by TI#20 glass, has a $(c/v)_{film}$ in the range 2.65 to 2.7, and the mode dispersion curves are similar to those shown in FIG. 6. Equation (3) is then satisfied with a value of $s\lambda/d \approx -0.8$, so that with $s=-1$, $d=1.15\mu m$. A first-order diffraction with an easily constructed grating spacing is needed. A sinusoidal amplitude grating or a phase grating could be used. Since the film guide 16 has air as its third layer, the grating should be at the edge of the thin film laser; otherwise, the GaInAs will form the third layer of the guide.

Some leeway for error is provided in that the emission wavelength occurs in a 100 A band; i.e., the value of $\lambda/d$ is spread by about 1%. Additional broadening could be obtained from a variable spacing or multiple spacing of the grating elements at the expense of diffraction efficiency. The grating used in this work is a hologram of a flat surface of a certain orientation. A 1% variation in $d$ can be achieved by making a hologram of a cylindrical curved surface or a vibrating flat surface. Cancellation of the grating pattern in the photoresist film will occur for gratings longer than 50 $\mu$m, which is much longer than the grating needs to be.

Optimum conditions have been determined for producing grating couplers on chalcogenide glass, oxide glass, Si, and GaAs surfaces. A coating of Shipley AZ1350 positive photoresist diluted one to one with Shipley thinner is spun onto the surface at 3000 rpm. This produces a resist layer 1500 A thick. The resist is exposed by two intersecting collimated light beams obtained from the same argon ion laser. Photoelectric measurement across each beam aids in optical alignment and ensures that the beams are matched in intensity. Only a small central portion of each Gaussian beam is used to expose the resist. The intersecting beams, making angles $\theta_1$ and $\theta_2$ (which are usually equal) with the resist-covered surface, produce interference fringes separated by $\lambda |\cos \theta_1 + \cos \theta_2|^{-1}$. $\lambda$ has been 4880 A. Exposure time depends on the substrate used and varies from three to ten minutes. Slight overexposure produces a grating consisting of bars of resist of rectangular cross section separated by strips of uncovered substrate after development of the resist. Exposure and development times have been found to be quite critical in producing good gratings. Careful cleaning of the substrate before applying resist is also essential.

Grating patterns have been cut into the substrates with the aid of an ion milling machine, in which a stream of argon ions impinges on the surface being milled. The photoresist is removed more slowly than the substrate. For example, the milling rates for resist and GaAs have been measured to be 0.06 $\mu$m/min and 0.12 $\mu$m/min, respectively, in particular instances. Grating periodicity in this case was 0.64 $\mu$m.

In a particular form of the laser-waveguide device, as shown in FIG. 1, pumping radiation of approximately 9000 A wavelength is emitted from a standard GaAs injection laser serving as the laser source 10, passes through a GaAs substrate 12 and is absorbed by the layer 15 of GaInAs (a few micrometers thick) which forms the active thin film lasing structure. This layer 15, thus optically excited and provided with feedback via reflection from the parallel faceted growth surfaces of the GaAs mesa structure 14, emits coherently in the 9100 to 12,000 A region to establish the circulating power characteristic of a guided film laser resonator. Transverse confinement of this circulating power, however, takes place not via the conventional normal mode behavior of optical cavities, but rather via the dielectric waveguiding properties caused by the higher index of refraction of the GaInAs lasing layer 15. Removal of this circulating laser emission is accomplished by the grating coupler 18, which is fabricated directly into the lasing layer by photoresist and ion milling techniques. Radiation which does couple out through the grating 18 subsequently finds itself confined by the three-layer dielectric waveguide structure 16 to propagation in the higher index single mode chalcogenide glass layer 21. Thus, the integrated thin film laser-coupler-waveguide structure is achieved.

Figure 8A:
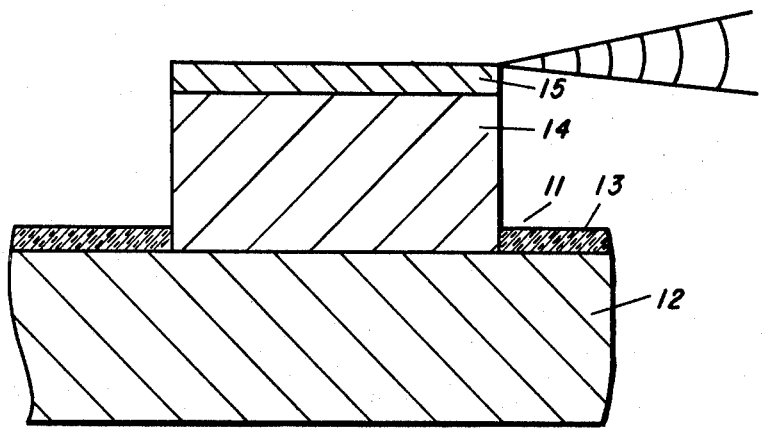
FIG. 8(a) is a longitudinal sectional view of an end-fire laser output observation.
Figure 8B:
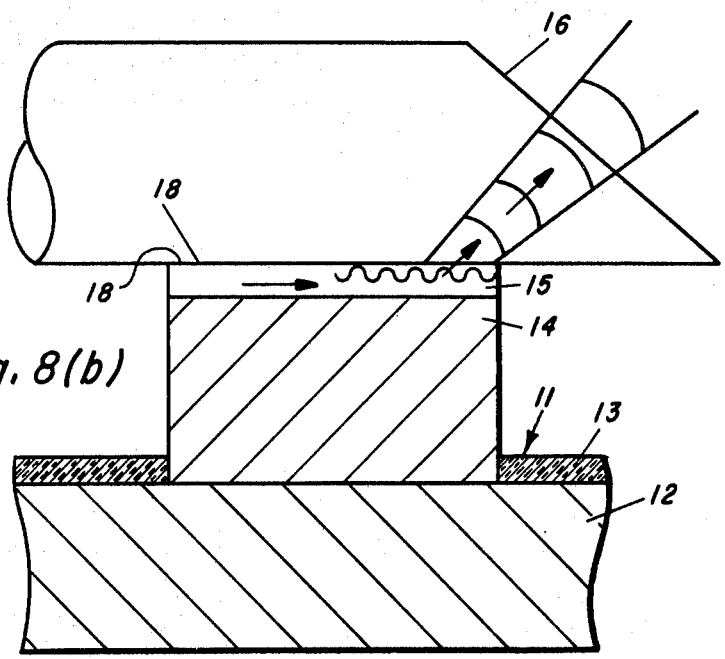
FIG. 8(b) is a longitudinal sectional view similar to FIG. 8(a), but showing a grating-coupled laser output observation.
Figure 11:
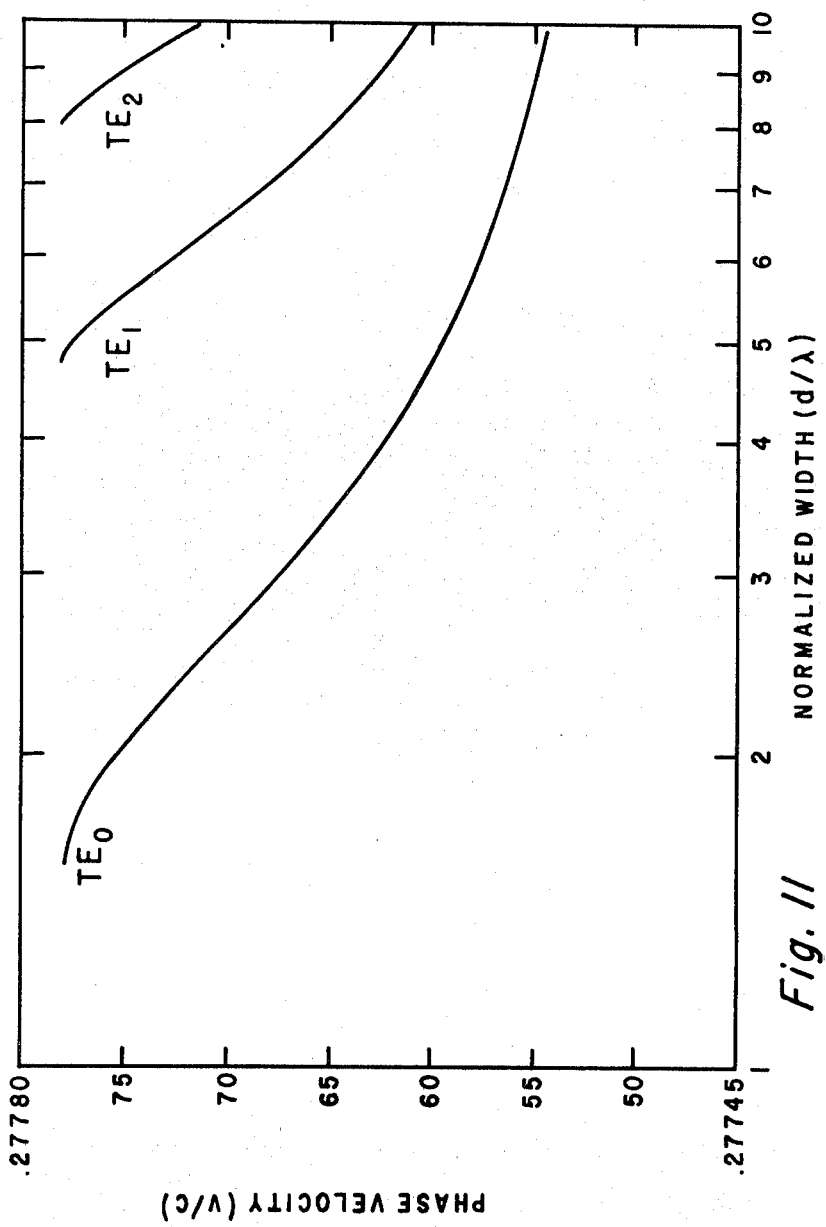
FIG. 11 is a graph showing dispersion curves for the TE modes of the $n+ -n$ waveguide of FIG. 10.
Figure 14:
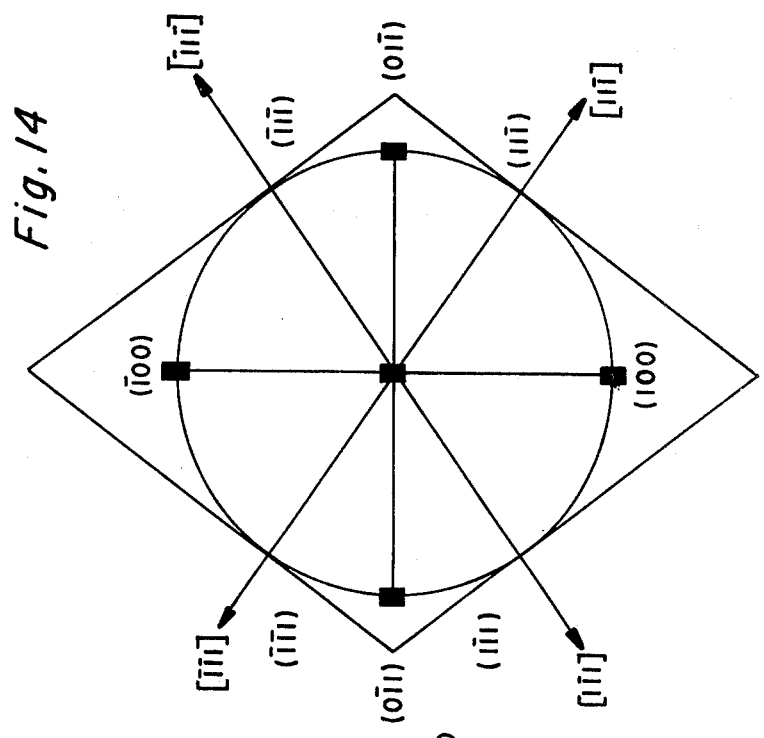
FIG. 14 is a diagrammatic view showing {110} stereographic projection of the diamond mesa geometry.

The lasing outputs of the mesa surface laser structures can be observed and correlated via two different experimental techniques. First, as indicated in FIG. 8(a), the freshly fabricated surface lasers can be optically pumped and lased prior to grating fabrication. At this stage the simple "end-fire" output through the faceted ends can be observed and measured for wavelength, intensity distribution as a function of angle, and other relevant parameters. Then, after grating fabrication, the laser output can be coupled through the grating into bulk chalcogenide glass slabs as illustrated in FIG. 8(b). The measurements of "end-fire" output, together with the theoretical basis previously described for determining the relationship between phase velocities and a grating coupling (and simple application of Snell's Law) should permit these observations to yield a reasonable understanding of the mode structure and dispersion characteristics of the lasing structure. Furthermore, such measurements should lead to optimization of the grating length and periodicity.

Referring now to FIGS. 9 to 16 (b) there is described an integrated electrical injection laser=waveguide device embodiment in accordance with the present invention.

The promise of optical communications lies in the rapid processing of large quantities of information with integrated optical circuits (IOC's) transmitting the information via optical fibers. Fulfillment of this promise requires the development of a reliable, cost-effective technology for producing the fibers and the IOC transmitters and receivers.

Optical fibers with very low loss transmission ($\sim$2 dB/km) have been reported recently, and efficient photodetectors that can be well coupled to fibers are commercially available. In addition, incoherent detection appears adequate for future IOC's, and no great departure from current techniques in detector design is anticipated. Thus, basic optical fibers and photodetector technologies appear to be in hand.

The situation is quite different with respect to transmitter devices. Light emitting diodes couple poorly to fibers and have response times too long to permit high data rate ($>$100 MHz) transmission. Discrete semiconductor lasers can be directly modulated more rapidly and made to couple more efficiently into optical fibers; however, this single-chip design precludes the inclusion of the necessary processing functions, e.g., multiplexing, modulation, and switching, on the same chip. Thus, the most critical technical problems are in the area of transmitter development. To develop reliable, cost-effective transmitter IOC's that fulfill all circuit function requirements, a monolithic fabrication technology must be evolved.

To this end, FIG. 9 is a representation of an IOC which contains the basic functions deemed necessary for a high data rate transmitter. The integrated optical circuit 30 comprises a substrate 31 of semiconductor material which is provided with a surface injection laser 32 for feeding laser radiation to a three-dimensional delineated waveguide 33 defined on the substrate 31. Modulation and switching of the laser radiation occur in the waveguide structure 33 and are controlled separately. In this respect, an electro-optic modulator 34 is disposed across the waveguide portion extending from the output of the surface injection laser 32 and is located in advance of a "tee" branch 35 in the waveguide 33 which extends into two branch waveguide portions 36 and 37. A separate waveguide portion 40 is provided on the substrate 31, being located in spaced relation to the branch waveguide portion 37 and having at least part of its length in close proximity to the branch waveguide portion 37. An acousto-optic switch 41 lies astride the proximate portions of the branch waveguide portion 37 and the waveguide portion 40 and is operable to switch radiation from the branch waveguide portion 37 to the waveguide portion 40. The entire transmitter is a single chip functional block with each device component compatible with integrated, low-cost manufacture.

A preferred semiconductor material for the development of such a transmitter is that of the III-V semiconductor alloys (Ga,In)As and (Ga,Al)As as provided on a III-V semiconductor substrate such as GaAs. The properties of these semiconductors permit performance, in principle, of each of the basic functions included in the device of FIG. 9: coherent optical emission, passive optical coupling, optical waveguiding, electrooptic modulation, and acousto-optic modulation. The emission wavelength of the surface laser can be tailored to match regions of low fiber loss by changing the alloy composition.

In accordance with this invention there is provided a semiconductor electrical injection laser 50 that is localized on the surface of a chip 51. This laser 50 is a p-n junction device with "mirror" reflectivity furnished by the crystalline facets of a mesa 52 that is vapor grown on an epitaxial layer of a substrate through an oxide mask 53, the substrate and epitaxial layer comprising the chip 51.

Referring to FIGS. 10(a) and 10(b), the p-n junction of the laser 50 is defined in the mesa 52 by a first region 54 of n-type conductivity and a second region 55 of p-type conductivity disposed atop the first region 54. The chip 51 includes a substrate 56 having an epitaxial layer 57 of semiconductor material disposed thereon, wherein the epitaxial layer 57 is of n-type conductivity and has a majority carrier concentration of lower magnitude as compared to that of the n-type substrate 56. In this embodiment of the mesa laser 50, the first and second regions 54, 55 comprising the mesa 52 with faceted side surfaces and forming the p-n junction are preferably grown of (Ga,In)As alloy material. These regions 54,55 cooperate with the substrate 56 and its epitaxial layer 57 which are preferably GaAs to provide a (Ga,In)As-GaAs surface laser. The basic concept of the semiconductor mesa laser structure 50 is extended from the optically pumped device 11 of FIG. 1, which requires an external laser pump 10, to an electrically pumped p-n junction device that is driven by its own internal injection current. The injection laser 50 is constructed so that its output will couple to an underlying epitaxial waveguide on the same substrate, as contrasted to the embodiment of FIG. 1. Thus, the injection laser 50 of FIG. 10(a) is a truly integrated, single coherent optical source for coupling into an integrated, delineated waveguide occupying the same substrate wherein the waveguide is formed from the epitaxial layer 57 of the substrate 56.

The injection laser device structure 50 illustrated in FIG. 10(a) operates in the following way. The p-n junction formed in the grown (Ga,In)As alloy mesa 52 is made to lase by injection of minority carriers (electrons) across the junction. Optical feedback is furnished by the opposite parallel faceted faces of the mesa 52. The laser output is coupled into the underlying GaAs waveguide comprising the epitaxial layer 57 and the substrate 56 by evanescent field coupling. Since GaAs has a larger energy bandgap than the (Ga,In)As mesa 52, the underlying waveguide will be nominally transparent (loss $\sim 1$ dB/cm) to the emission of the mesa laser. Three-dimensional confinement of the radiation in the waveguide will be achieved via an overlay structure, described hereinbelow.

A specific example of the device of FIG. 10(a) may be optically characterized as follows. Away from the mesa 52, the GaAs epitaxial film 57 ($n \sim 10^{16}$ cm$^{-3}$) forms a waveguiding layer on top of the heavily doped ($n \sim 10^{18}$ cm$^{-3}$) substrate 56. Optical confinement occurs because the refractive index of the epitaxial layer 57 is $\sim 10^{-3}$ larger than the index of the substrate 56. As shown by the TE mode dispersion curves of FIG. 11, confinement occurs for waveguide thicknesses $d \gtrsim 1.6\lambda$. Since $\lambda \sim 1 \mu$m, single $TE_0$ mode propagation occurs for $1.6 \mu m \lesssim d \lesssim 4.8 \mu m$. Near the mesa, the situation is more complicated. There are two optical waveguides (one is the optically active junction region of the mesa) coupled by a lower index buffer layer, as indicated by the index profile shown in FIG. 10(b). Evanescent coupling between these two waveguides (high index regions) occurs via field leakage through the buffer layer ($n \sim 10^{17}$ cm$^{-3}$) at the bottom of the mesa. The coupling has been calculated for a similar structure involving a large optical cavity injection laser with a step discontinuity in index of $\sim 10^{-2}$. Reasonably efficient coupling occurs for a buffer layer with a thickness $\sim 1 \mu$m. For the simple p-n junction laser of FIG. 10 the index profile near the junction is not the ideal step function, and the optical radiation is not as well confined. Thus, it is contemplated that the coupling may be more efficient and more easily obtained with thicker (several micrometers) buffer layers. Such dimensions are readily achievable with current vapor epitaxy technology.

The device of FIG. 10(a) is fabricated using vapor phase epitaxial growth, type conversion by diffusion, and/or ion implantation, and photolithographic masking techniques. First, a uniform epitaxial film 57 (the waveguide) of GaAs is grown on a heavily doped substrate 56. The semiconductor slice 51 is then coated with an insulation film 53 of suitable material, such as SiO$_2$, into which holes are etched for mesa growth. An n-type mesa 52 is then grown through the mask holes. A diffusion mask 60 of suitable material, such as Si$_x$N$_y$, is then deposited over the grown mesa 52. Diffusion or implantation of a p-type impurity, such as Zn, through etched holes on the mesa tops converts the top layer 55 to p-type and forms the p-n junction with the n-type bottom layer 54 of the mesa 52. Following junction formation, a metal contact 61 is alloyed to the mesa top and a metal contact 62 is alloyed to the substrate 56. The contacts 61 and 62 may be of a suitable metal, such as gold. Soldering to a device header and lead bonding completes the device 50.

Fabrication of the mesa injection laser 50 in accordance with the foregoing procedure requires several specific techniques to be carried out, including:

(1) growth of GaAs, and the (Ga,In)As alloy mesas with good facets for optical feedback;

(2) use of diffusion or implantation techniques for junction formation in n-type GaAs and (Ga,In)As mesas;

(3) preparation of low carrier density n-type GaAs waveguide on a highly doped n-type substrate;

(4) growth of (Ga,In)As mesas on epitaxial GaAs substrates;

(5) control of diffusion depth and/or buffer layer thickness for proper coupling between the mesa and the waveguide; and (6) use of ohmic contacting methods for the small mesa structures.

Further in accordance with this invention, a dual source reactor is provided, as illustrated in FIG. 12. The reactor comprises a housing 70 which defines a chamber for receiving an elongated reactor tube 71. The housing 70 is divided into plural heating zones, including a first end heating zone 70a, an intermediate heating zone 70b, and a second end heating zone 70c. The reactor tube 71 includes separate gallium and indium sources 72 and 73 located therewithin at the intake end of the tube 71 which is disposed in the first heating zone 70a. Inlet tubes 74 and 75 are connected to the intake end of the reactor tube 71, respectively communicating with the gallium and indium sources 72 and 73. Sources of $HCl/H_2$, $H_2$, or He communicate with each of the inlet tubes 74 and 75.

A GaAs substrate 76 is placed within the reactor tube 71 at the portion thereof within the second end heating zone 70c. Inlet tubes 77 and 78 communicate with the interior of the reactor tube 71 located within the intermediate heating zone 70b so as to introduce selected gases into the reactor tube 71 between the sources of gallium and indium 72, 73 and the GaAs substrate 76. Sources of $HCl/H_2$, $H_2$, or He communicate with the inlet tube 77, while sources of $AsH_3/H_2$, $H_2$, or He communicate with the inlet tube 78. The discharge end of the reactor 71 is provided with a flushing inlet 79 communicating with a source of $H_2$ or He and an exhaust outlet 80 for discharging reaction gases and residual gases. In this system, the separate gallium and indium metallic sources 72, 73 are exposed to $HCl/H_2$ mixtures introduced to the reactor tube 71 via the inlet tubes 74, 75. The volatile chlorides formed from the reaction of HCl in In and Ga are mixed with As vapor formed from the decomposition of $AsH_3$, a separate input gas introduced via the inlet tube 78. The volatile chlorides and As vapor are then passed over the GaAs substrate 76. The flow conditions and temperature are adjusted so that epitaxial films deposit on the GaAs substrate 76. This open tube flow system has been used to grow abrupt heteroepitaxial (Ga,In)As alloys with InAs contents as high as 20%. The alloy layers are n-type with carrier density of about $10^{16}$ cm$^{-3}$.

Two additional features of this reactor add to its versatility. First, an extra $HCl/H_2$ supply introduced via the inlet tube 77 prevents deposition at temperatures above that of the substrate 76. This feature provides better compositional control during deposition. Second, it is possible to independently control the In/Ga ratio in the gas phase. This feature allows for grading of the composition of the films to minimize the effects of lattice mismatch between the GaAs substrate 76 and the (Ga,In)As alloys. In addition, the use of separate group III sources 72, 73 simplifies changing composition for heteroepitaxial growth.

Figure 13:
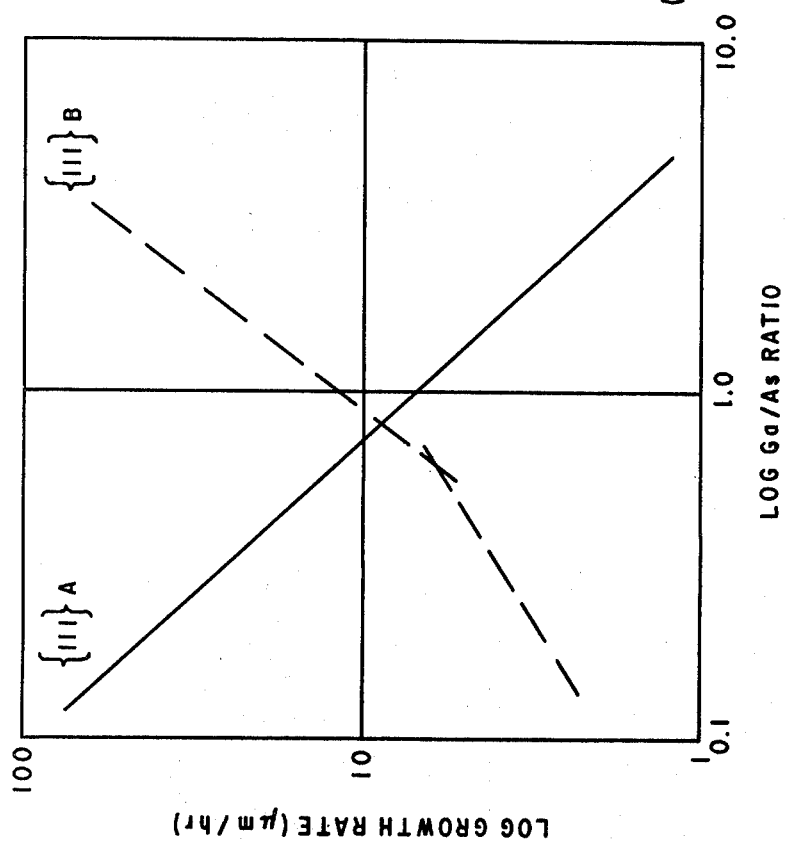
FIG. 13 is a graph showing the effect of gas composition on the relative growth rate of A and B {111} GaAs planes.

Also important however, is the ease of control of gas phase composition for the control of faceted mesa growth of GaAs and (Ga,In)As. Control of the III/V ratio in the gas phase makes it possible to equalize the growth rates of the {111} planes of opposite polarity. This effect of gas composition on the relative growth rates is illustrated in FIG. 13 for GaAs epitaxy. Combination of this effect with appropriate substrate orientations results in the growth of parallel, plane mesa facets. The exact relationship of the {111} planes on a {110} substrate are illustrated in the stereographic projection shown in FIG. 14. The projection is circumscribed by a diamond, the sides of which are {111} planes. This diamond structure or variations of it, etched into a silicon dioxide film on a GaAs {110} substrate, serves as a basis for mesa growth of GaAs and (Ga,In)As with planar faceted side surfaces. A change of a factor of two in composition destroys the twofold rotation axis of grown mesas. This effect has also been observed in (Ga,In)As alloys, but not so dramatically as in GaAs mesa growth.

The injection semiconductor mesa layer 50 requires a p-n junction. To accomplish this task, Zn diffusion and/or ion implantation is provided to convert a top region of an n-type mesa to p-type. This includes masking and photolithography for defining a diffused area on top of the mesa 52. Silicon nitride (rf plasma-deposited) is a good mask, impermeable to zinc in closed-ampoule diffusions, and is preferably employed as the diffusion mask 60.

Referring to FIGS. 15(a), 15(b) and 15(c), an integrated optical circuit must incorporate three-dimensional optical waveguides that can be arranged in a delineated pattern for modulation, switching, and multiplexing. However, most previous optical waveguides have dealt with two-dimensional, thin-film waveguides that do not yield the radiation channeling required by various circuit functions. Three types of delineated three-dimensional waveguides suitable for circuit definition in semiconductor epitaxial layers are shown in FIGS. 15(a), 15(b) and 15(c): 15(a) the embedded channel formed by proton bombardment, ion implantation, or diffusion; 15(b) the ridge or raised channel waveguide formed by chemical etching or ion milling; and 15(c) the dielectric-overlay waveguide. Optical waveguiding occurs in the shaded regions.

Preliminary reports concerning both embedded and ridge channel waveguides in III-V epitaxial layers have appeared in the literature. While both appear to be promising candidates for integrated optical circuits, both require smooth, well-defined edges for low-loss propagation. For the dielectric-overlay waveguide, propagation and confinement occur in the two-dimensional film and restrictions on edge definition are relaxed. Furthermore, requirements on the optical quality of the delineating (overlayed) strip are minimal.

High quality single and multiple epitaxial layers of GaAs and (Ga,In)As employed as optical waveguides have demonstrated low signal losses on the order of 1 dB/cm, as have optical quality TI-1173 chalcogenide glass sputtered films that have photoresist pattern overlays where the signal losses have been less than 2 dB/cm when serving as delineated waveguides. Evidence of optical confinement at 1.15 $\mu$m in a vapor-grown, 7 $\mu$m thick, epitaxial layer of (Ga,In)As on a GaAs substrate is shown in FIG. 16(a). A dramatic sharpening of the transmitted intensity profile is observed when the input laser beam is focused on the epitaxial layer. The waveguide scanning apparatus used for these measurements is shown in FIG. 16(b). The GaAs substrate 90 having the epitaxial film 91 of (Ga,In)As is subjected to laser radiation from a laser source 92 such that laser radiation is incident on the epitaxial film 91 which serves as a waveguide. A vibrating mirror 93 sweeps a magnified image of the waveguide output repetitively across a narrow slit 94, generating the intensity profile display on an oscilloscope screen 95 through an intermediate phototube 96. The waveguide output may also be monitored by an infrared vidicon 97 which directs video signals representative thereof to a television receiver 98 for visual display.

With respect to the modulator 34 included in the monolithic integrated optical circuit shown in FIG. 9, it will be understood that the output from the laser 32 may be directly modulated through variation of the injection current where the laser 32 is of the type shown in FIG. 10(a). However, separate modulation capabilities to achieve maximum bandwidth and versatility, such as multiplexing, for example, may be provided by the modulator 34. It is contemplated that the modulator 34 may be of either acousto-optic or electro-optic character in modulating optical beams in delineated optical waveguides of chalcogenide glasses or III-V semiconductor material.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A monolithic semiconductor laser comprising:

a substrate of semiconductor material taken from the group consisting of III-V semiconductor compounds and mixed ternary III-V semiconductor compositions, an epitaxial waveguide of semiconductor material disposed on said substrate and being of one type conductivity material, a mesa of semiconductor material taken from the group consisting of III-V semiconductor compounds and mixed ternary III-V semiconductor compositions mounted on said epitaxial waveguide of said substrate, said mesa including a first lower region of semiconductor material of said one type conductivity contacting said epitaxial waveguide and a second upper region of semiconductor material of the other type conductivity disposed atop said first region of semiconductor material, thereby defining a p-n junction between said first and second regions of said mesa, said first and second regions having opposite parallel faceted faces, thereby providing for optical feedback electrical contacts respectively mounted atop said mesa in engagement with said second region of the other conductivity type semiconductor material and the surface of said substrate remote from said epitaxial layer, and means attached to said contact atop said mesa for connecting said contact to an electrical power source, whereby said p-n junction formed in said mesa being responsive to said electrical power source is made to lase by the injection of minority carriers across said junction thereby producing laser radiation that is coupled into said epitaxial waveguide.

* * * * *